(12) United States Patent
Waku

(10) Patent No.: US 10,080,286 B2
(45) Date of Patent: Sep. 18, 2018

(54) CARBON-FIBER-REINFORCED PLASTIC STRUCTURE AND METHOD FOR PRODUCING SAME

(75) Inventor: Hiroyuki Waku, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 43 days.

(21) Appl. No.: 13/985,363

(22) PCT Filed: Feb. 15, 2012

(86) PCT No.: PCT/JP2012/053522
§ 371 (c)(1),
(2), (4) Date: Aug. 14, 2013

(87) PCT Pub. No.: WO2012/111704
PCT Pub. Date: Aug. 23, 2012

(65) Prior Publication Data
US 2013/0319750 A1    Dec. 5, 2013

(30) Foreign Application Priority Data

Feb. 16, 2011    (JP) ................................. 2011-030883

(51) Int. Cl.
*H05K 1/11*    (2006.01)
*B29C 70/88*    (2006.01)
(Continued)

(52) U.S. Cl.
CPC ............ *H05K 1/115* (2013.01); *B29C 70/882* (2013.01); *B64C 3/18* (2013.01); *B64C 3/20* (2013.01);
(Continued)

(58) Field of Classification Search
CPC ..... B29C 70/882; B29K 2307/04; B64C 3/18; B64C 3/20; B64C 3/26; B64D 45/02;
(Continued)

(56) References Cited

U.S. PATENT DOCUMENTS 3,755,713 A * 8/1973 Paszkowski .................. 361/218
3,989,984 A * 11/1976 Amason et al. ............... 361/212
(Continued)

FOREIGN PATENT DOCUMENTS

CA    2 739 477    4/2010
CN    101258021 A    9/2008
(Continued)

OTHER PUBLICATIONS

Russian Federation Notice of Allowance dated Aug. 22, 2014 in corresponding Russian Federation Application No. 2013137704 with English translation.
(Continued)

*Primary Examiner* — Timothy Thompson
*Assistant Examiner* — Rhadames J Alonzo Miller
(74) *Attorney, Agent, or Firm* — Wenderoth, Lind & Ponack, L.L.P.

(57) ABSTRACT

A spar includes a conductive layer laminated and formed on a carbon-fiber prepreg, and a jumper formed of a conductor which penetrates through the conductive layer and the carbon-fiber prepreg.

12 Claims, 6 Drawing Sheets

(51) Int. Cl.
*B64C 3/20* (2006.01)
*B64C 3/26* (2006.01)
*B64D 45/02* (2006.01)
*H05K 13/00* (2006.01)
*B64C 3/18* (2006.01)
*B29K 307/04* (2006.01)
*H05K 1/03* (2006.01)
*H05K 3/46* (2006.01)

(52) U.S. Cl.
CPC .............. *B64C 3/26* (2013.01); *B64D 45/02* (2013.01); *H05K 13/00* (2013.01); *B29K 2307/04* (2013.01); *H05K 1/0366* (2013.01); *H05K 3/4602* (2013.01); *H05K 3/4632* (2013.01); *H05K 2201/029* (2013.01); *H05K 2201/0323* (2013.01); *H05K 2201/10363* (2013.01); *Y02T 50/43* (2013.01); *Y10T 29/49117* (2015.01)

(58) Field of Classification Search
CPC ........ H05K 13/00; H05K 1/115; Y02T 50/43; Y02T 50/433
USPC .......... 174/264; 29/825; 361/218; 244/117 R
See application file for complete search history.

(56) References Cited

U.S. PATENT DOCUMENTS

| | | | |
|---|---|---|---|
| 6,327,132 B1* | 12/2001 | Andrivet et al. | 361/218 |
| 2004/0040738 A1* | 3/2004 | Tani et al. | 174/250 |
| 2007/0177330 A1* | 8/2007 | Ackerman et al. | 361/220 |
| 2008/0137259 A1 | 6/2008 | Heeter et al. | |
| 2009/0029180 A1* | 1/2009 | Oguri et al. | 428/457 |
| 2009/0114427 A1* | 5/2009 | Feider | H05K 3/225 174/254 |
| 2010/0020461 A1* | 1/2010 | Heeter et al. | 361/218 |
| 2010/0132875 A1* | 6/2010 | Ackerman et al. | 156/98 |
| 2010/0224724 A1* | 9/2010 | Kamino et al. | 244/1 A |
| 2010/0320315 A1* | 12/2010 | Kashiwagi | B64D 45/02 244/1 A |
| 2011/0174536 A1* | 7/2011 | Wilson et al. | 174/84 S |
| 2011/0297315 A1* | 12/2011 | Kishida et al. | 156/324 |
| 2012/0234977 A1* | 9/2012 | Kawahara et al. | 244/131 |
| 2013/0087380 A1* | 4/2013 | Dilligan et al. | 174/650 |

FOREIGN PATENT DOCUMENTS

| | | | |
|---|---|---|---|
| CN | 101484290 A | | 7/2009 |
| CN | 101855132 A | | 10/2010 |
| EP | 1 995 349 A1 | | 11/2008 |
| EP | 2 184 227 | | 5/2010 |
| JP | 2-63725 | | 3/1990 |
| JP | 09-193296 | | 7/1997 |
| JP | 2007-246967 | | 9/2007 |
| JP | 2009-506952 | | 2/2009 |
| JP | 2009-227166 | | 10/2009 |
| JP | 2010-194749 | | 9/2010 |
| JP | 2012-131239 | | 7/2012 |
| JP | 2012-169533 | | 9/2012 |
| RU | 2 041 508 C1 | | 9/1995 |
| WO | 2007/030371 | | 3/2007 |
| WO | WO 2010037991 A1 * | 4/2010 | ........... B29C 70/443 |

OTHER PUBLICATIONS

Chinese Office Action dated Aug. 5, 2014 in corresponding Chinese Patent Application No. 201280008083.8 with partial English translation.

International Search Report dated May 1, 2012 in International (PCT) Application No. PCT/JP2012/053522 with English translation.

Written Opinion of the International Searching Authority dated May 1, 2012 in International (PCT) Application No. PCT/JP2012/053522 with English translation.

Canadian Office Action dated Jun. 3, 2014 in corresponding Canadian Patent Application No. 2,827,396.

* cited by examiner

CARBON-FIBER-REINFORCED PLASTIC STRUCTURE AND METHOD FOR PRODUCING SAME

FIELD OF THE INVENTION

The present invention relates to a carbon-fiber-reinforced plastic structure formed of carbon-fiber-reinforced plastic and a method of producing the same. Priority is claimed on Japanese Patent Application No. 2011-030883, filed Feb. 16, 2011, the content of which is incorporated herein by reference.

BACKGROUND ART

In the related art, a structure constituting a main wing of an aircraft is generally constituted of a metallic member such as an aluminum alloy. Accordingly, a metallic structure as described above has a secondary function of electrically grounding various electronic devices attached to a surface of the structure, that is, securing conduction with a reference potential point, as well as a function as the structural object.

However, from the point of view of weight reduction, strength reinforcement, or the like of a main wing, a principal structure of the main wing has recently been formed of a so-called composite material, for example, carbon-fiber-reinforced plastic (hereinafter abbreviated to as "CFRP") (for example, see Patent Literature 1). A carbon-fiber-reinforced plastic structure (hereinafter abbreviated to "CFRP structure") is configured by heating a carbon-fiber prepreg formed by laminating a plurality of sheets, each of which has a carbon fiber impregnated with a thermosetting resin, and hardening the thermosetting resins to integrate the plurality of sheets. Accordingly, in the above-described CFRP structure, a so-called resin layer is formed on a surface of the structure by the thermosetting resin exuded from the carbon fiber when the carbon-fiber prepreg is heated.

RELATED ART DOCUMENT

Patent Document

[Patent Literature 1]
Japanese Unexamined Patent Application, First Publication No. H9-193296

DISCLOSURE OF THE INVENTION

Problems to be Solved by the Invention

However, the carbon fiber itself is conductive in the CFRP structure of the related art, but the entire structure is not conductive because its surface is covered with a non-conductive resin layer. Accordingly, the CFRP structure of the related art is likely not to have the secondary function of electrically grounding an electronic device attached to the surface.

The present invention has been made in view of the above-described circumstances, and an object of the invention is to provide means for adding a secondary function of electrically grounding an electronic device attached to a surface of a CFRP structure formed of CFRP to the CFRP structure.

Solution to Problem

According to a first aspect of the present invention, a CFRP structure includes: a conductive layer laminated and formed on a carbon-fiber prepreg; and a jumper formed of a conductor which penetrates through the conductive layer and the carbon-fiber prepreg.

According to this configuration, when an electronic device is provided in contact with the conductive layer, the electronic device is electrically connected to the carbon-fiber prepreg serving as a reference potential point via the conductive layer and the jumper. Thereby, it is possible to electrically ground the electronic device provided on a CFRP structure.

In addition, in the CFRP structure, the conductive layer may be formed on a surface of the carbon-fiber prepreg.

According to the above-described configuration, because the conductive layer is formed on the surface of the carbon-fiber prepreg, the electronic device can be provided in direct contact with the conductive layer. Thereby, because wiring and the like for electrically connecting the electronic device and the conductive layer are unnecessary, the electronic device can be electrically grounded through a simple configuration.

In addition, in the CFRP structure, a head portion in contact with a surface of the conductive layer may be provided at an end of the jumper.

According to the above-described configuration, the jumper and the conductive layer are more securely electrically connected through the head portion in contact with the conductive layer.

In addition, according to a second aspect of the present invention, a method of producing a CFRP structure includes the steps of: forming a conductive layer on a surface of a carbon-fiber prepreg; masking a surface of the conductive layer; hardening the carbon-fiber prepreg; exposing the conductive layer by removing the masking; and causing a jumper formed of a conductor in contact with the conductive layer to penetrate through the carbon-fiber prepreg.

According to the above-described production method, it is possible to more securely establish an electrical connection between the jumper and the conductive layer because it is possible to locally prevent a resin layer from being formed on a surface of a carbon-fiber prepreg when the carbon-fiber prepreg is hardened.

In addition, when the electronic device is provided in contact with the conductive layer, the electronic device is electrically connected to the carbon-fiber prepreg serving as a reference potential point via the conductive layer and the jumper. Thereby, it is possible to electrically ground the electronic device provided on the CFRP structure.

In addition, according to a third aspect of the present invention, a method of producing a CFRP structure includes the steps of: forming a conductive layer on a surface of a carbon-fiber prepreg; hardening the carbon-fiber prepreg; and causing a jumper formed of a conductor having a projection on a lower surface to penetrate through the carbon-fiber prepreg while breaking a resin layer formed on the surface using the projection when the carbon-fiber prepreg is hardened.

According to the above-described production method, when the jumper is caused to penetrate through the carbon-fiber prepreg, the head portion of the jumper can come in contact with the conductive layer by breaking the resin layer using the projection provided on the jumper itself. Thereby, before the process of hardening the carbon-fiber prepreg, it is unnecessary to perform pre-processing such as the process of masking the surface of the carbon-fiber prepreg. Accordingly, it is possible to promote labor-saving due to the reduction of an amount of a work process and the reduction of cost due to the reduction of an amount of a masking tape or the like.

EFFECTS OF THE INVENTION

According to the aspects of the present invention, a secondary function of electrically grounding an electronic device attached to a surface of a CFRP structure formed of CFRP can be added to the CFRP structure.

DETAILED DESCRIPTION OF THE INVENTION (First Embodiment)

Hereinafter, embodiments of the present invention will be described with reference to the drawings. First, a configuration of a CFRP structure according to a first embodiment of the present invention will be described. In this embodiment, a member constituting a main wing of an aircraft will be described as an example of the CFRP structure.

Figure 1:
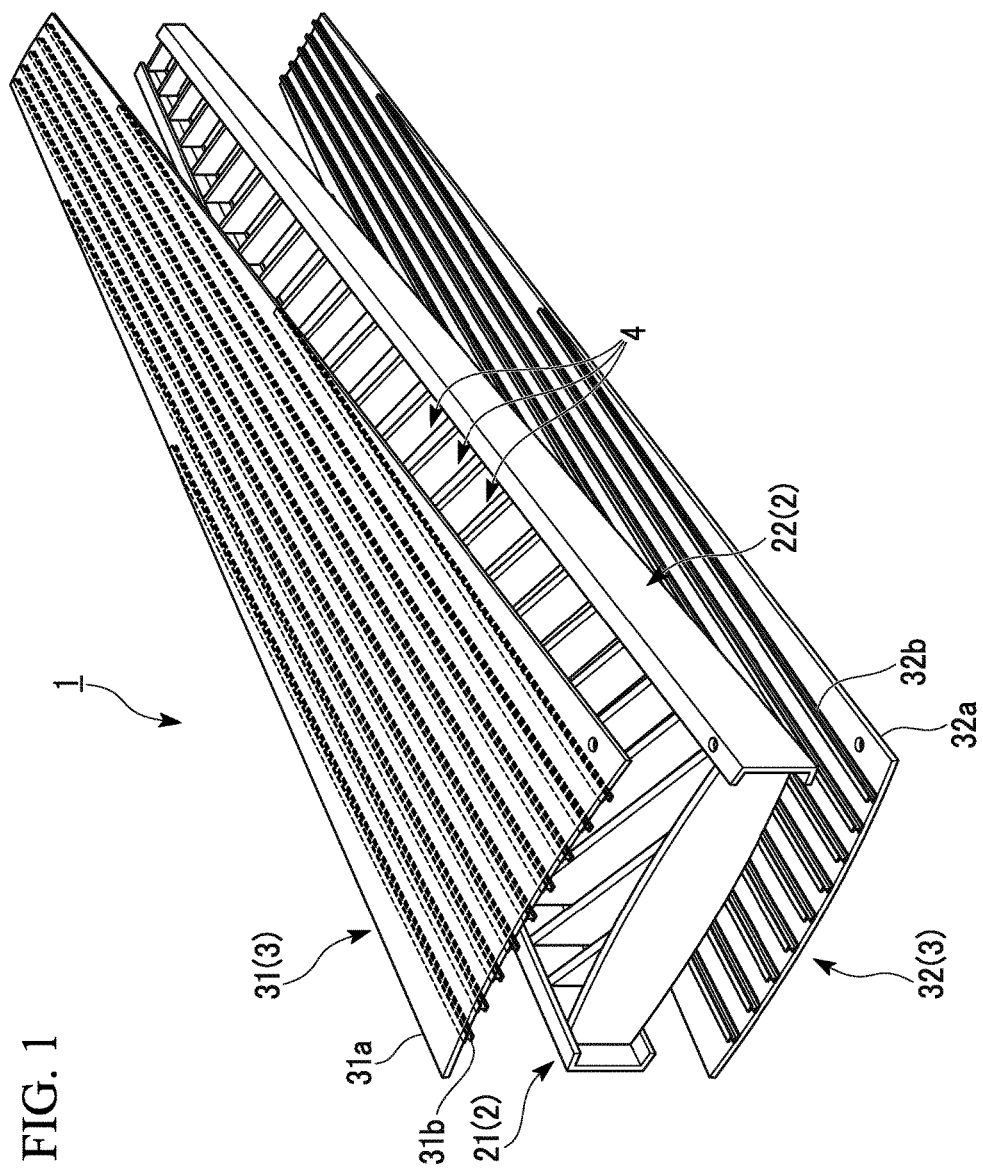
FIG. 1 is an exploded perspective view illustrating a schematic configuration of a main wing according to a first embodiment of the present invention.

FIG. 1 is an exploded perspective view illustrating a schematic configuration of a main wing 1. The main wing 1 includes one pair of spars 2, which form both sides in a longitudinal direction of the main wing 1, one pair of panels 3, which form an upper surface and a lower surface, and a plurality of ribs 4 provided inside the main wing 1.

As illustrated in FIG. 1, the one pair of spars 2 include a front spar 21 configured to form the side of the main wing 1 at the front of the aircraft of both the sides of the main wing 1 and a rear spar 22 configured to form the side of the main wing 1 at the rear of the aircraft. The one pair of spars 2 configured as described above are disposed at a predetermined interval so that respective openings of the spars 2 are caused to face each other. Furthermore, both the front spar 21 and the rear spar 22 are members formed of CFRP.

As illustrated in FIG. 1, the one pair of panels 3 include an upper panel 31 configured to form an upper surface of the main wing 1 and a lower panel 32 configured to form a lower surface. Accordingly, the upper panel 31 has a plate-like upper skin 31a having a curved cross-sectional shape and a plurality of stringers 31b provided on one surface of the upper skin 31a and configured to improve bending rigidity. Further, the upper skin 31a and the stringers 31b are all members formed of CFRP. Likewise, the lower panel 32 has a lower skin 32a and a plurality of stringers 32b, and these are all members formed of CFRP.

The plurality of ribs 4 are members for structurally reinforcing the main wing 1. The ribs 4 are provided at predetermined intervals in the longitudinal direction of the main wing 1 as illustrated in FIG. 1. One end of each rib 4 is connected to the front spar 21 and the other end is connected to the rear spar 22. Thereby, the front spar 21 and the rear spar 22 are retained at fixed intervals. Further, the ribs 4 are all metallic members.

Figure 2:
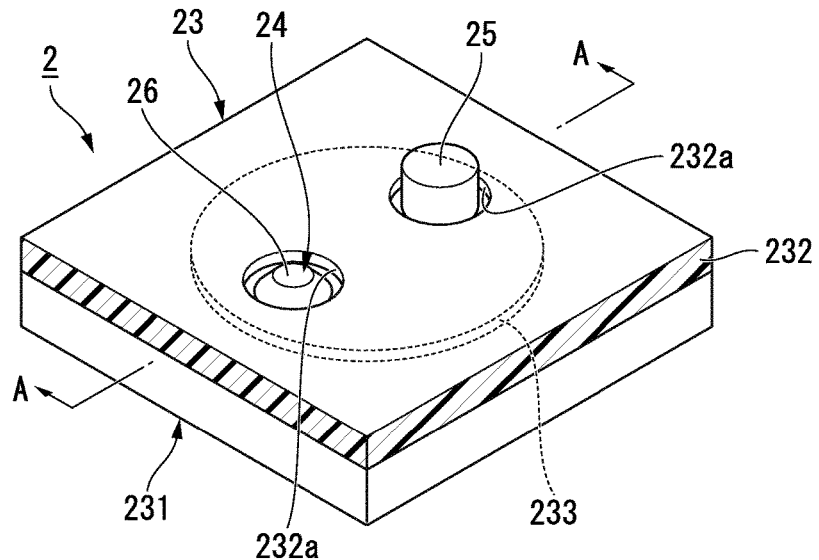
FIG. 2 is a schematic perspective view illustrating a part of a spar according to the first embodiment.
Figure 3:
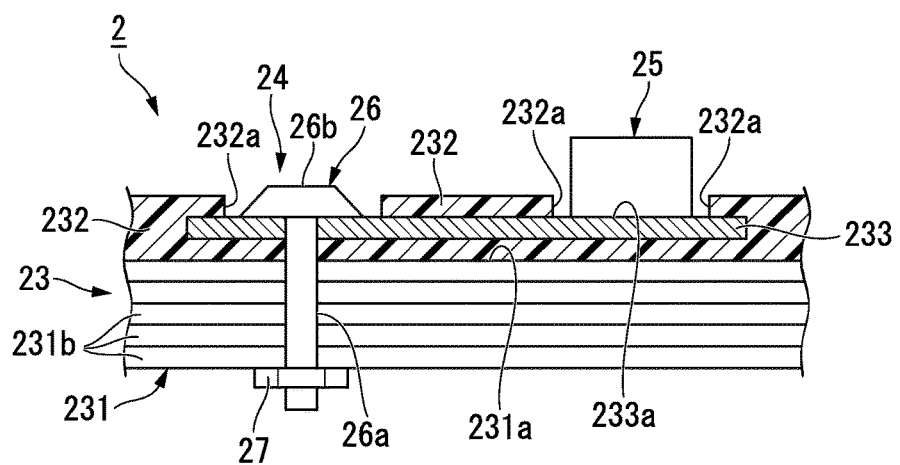
FIG. 3 is a schematic cross-sectional view illustrating a cross-section taken along a line A-A in FIG. 2.

FIGS. 2 and 3 are diagrams illustrating the spar 2 serving as the CFRP structure according to the first embodiment. FIG. 2 is a schematic perspective view illustrating part of the spar 2, and FIG. 3 is a schematic cross-sectional view illustrating a cross-section taken along a line A-A in FIG. 2. The spar 2 includes a spar main body 23 formed of CFRP, a jumper 24 provided to penetrate through the spar main body 23, and an electronic device 25 attached to a surface of the spar main body 23.

As illustrated in FIG. 3, the spar main body 23 includes a laminated carbon-fiber prepreg 231, a resin layer 232 formed on a surface 231a of the carbon-fiber prepreg 231, and a conductive layer 233 provided to be embedded in the resin layer 232.

The carbon-fiber prepreg 231 functions as a reference potential point. As illustrated in FIG. 3, the carbon-fiber prepreg 231 is configured by laminating a plurality of sheets 231b, each of which has a carbon fiber impregnated with a thermosetting resin (not illustrated), and hardening the thermosetting resins to integrate the sheets 231b. Accordingly, the carbon-fiber prepreg 231 constituted of the carbon fibers has conductivity.

The resin layer 232 is configured by forming the thermosetting resin exuded from the carbon fiber on the surface 231a of the carbon-fiber prepreg 231 when the thermosetting resin is hardened. The resin layer 232 formed of the thermosetting resin is a non-conductive insulator. As illustrated in FIGS. 2 and 3, the resin layer 232 is formed to cover the surface 231a of the carbon-fiber prepreg 231, and a plurality of conductive layer exposing holes 232a which expose the conductive layer 233 by penetrating through it at predetermined positions are formed.

The conductive layer 233 is a thin plate member formed of a metal such as copper or aluminum and has conductivity. As illustrated in FIGS. 2 and 3, the conductive layer 233 is formed in a substantially circular shape in plane view. A thickness of the conductive layer 233 is formed to be thinner than that of the resin layer 232. The conductive layer 233 configured as described above is provided in a state in which the conductive layer 233 is embedded in the resin layer 232 on the carbon-fiber prepreg 231. Further, the quality of a material or a shape of the conductive layer 233 is not limited to this embodiment, and a design change can be appropriately made.

The jumper 24 is electrically connected to the conductive layer 233 and the carbon-fiber prepreg 231. As illustrated in FIGS. 2 and 3, the jumper 24 includes a metallic bolt 26 provided to penetrate through the spar main body 23 and a nut 27 screwed on the bolt 26.

The bolt 26 has a shaft portion 26a of which a peripheral surface is cut as a male screw (not illustrated) and an umbrella-like head portion 26b provided on one end of the shaft portion 26a. The bolt 26 configured as described above is disposed at a position of the conductive layer exposing hole 232a formed in the resin layer 232. The shaft portion 26a of the bolt 26 is inserted into each of the conductive layer 233 and the carbon-fiber prepreg 231. A lower surface of the head portion 26b of the bolt 26 contacts with a surface 233a of the conductive layer 233 exposed from the conductive layer exposing hole 232a. In addition, in this state, a tip end of the shaft portion 26a projects from a backside of the spar main body 23. The nut 27 is screwed on the projecting shaft portion 26a. Accordingly, the jumper 24 is fixed to the spar main body 23 by fastening the spar main body 23 through the head portion 26b of the bolt 26 and the nut 27 in a thickness direction.

As illustrated in FIGS. 2 and 3, the electronic device 25 is disposed at a position of the conductive layer exposing hole 232a formed on the resin layer 232, and has a lower surface which contacts with the surface 233a of the conductive layer 233 exposed from the conductive layer exposing hole 232a. Accordingly, the electronic device 25 is electrically connected to the carbon-fiber prepreg 231 via the conductive layer 233 contacting with the electronic device 25 and the jumper 24 contacting with the conductive layer 233. Thereby, the electronic device 25 is in a state in which conduction with the reference potential point is secured. Further, a shape, a size, and the like of the electronic device 25 are not limited to this embodiment, and a design change may be appropriately made.

Next, a process of producing the spar 2, which is the CFRP structure according to the first embodiment of the present invention, and an operation and effects of the spar 2 will be described. FIGS. 4A, 4B, 4C, 5A, and 5B are explanatory diagrams illustrating processes of producing the spar 2 according to the first embodiment.

First, a worker forms the conductive layer 233 on the surface 231a of the carbon-fiber prepreg 231.

Figure 4A:
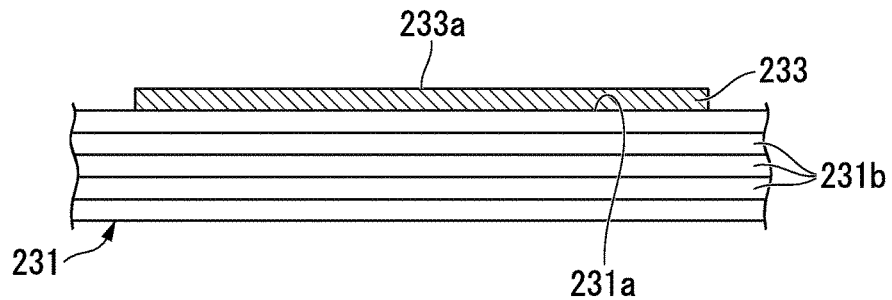
FIG. 4A is an explanatory diagram illustrating a process of producing the spar according to the first embodiment.

That is, as illustrated in FIG. 4A, the worker laminates the plurality of sheets 231b, each of which has a carbon fiber impregnated with a thermosetting resin. As illustrated in FIGS. 2 and 4A, the worker disposes the conductive layer 233 at a predetermined position on the surface 231a of the carbon-fiber prepreg 231. Further, the position at which the conductive layer 233 is disposed on the surface 231a of the carbon-fiber prepreg 231 is not limited to this embodiment, and an arbitrary change can be made according to a position at which the electronic device 25 and the jumper 24 are set to be installed.

Figure 4B:
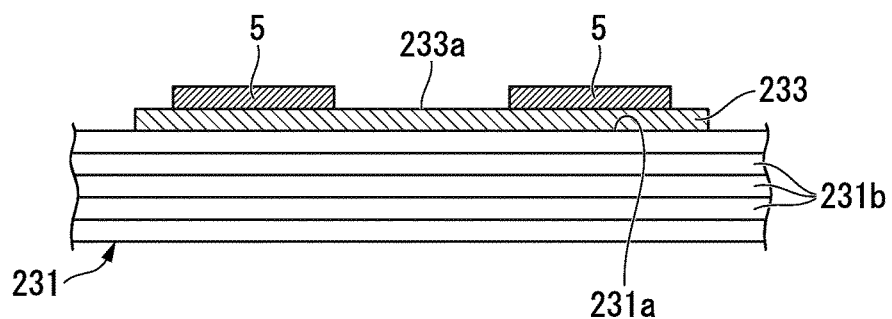
FIG. 4B is an explanatory diagram illustrating a process of producing the spar according to the first embodiment.

Next, the worker masks the surface 233a of the conductive layer 233. That is, the worker pastes a masking tape 5 cut according to a shape of the conductive layer exposing hole 232a illustrated in FIG. 2 to a predetermined position on the surface 233a of the conductive layer 233 as illustrated in FIG. 4B, in further detail, each position at which the electronic device 25 and the jumper 24 are set to be installed.

Figure 4C:
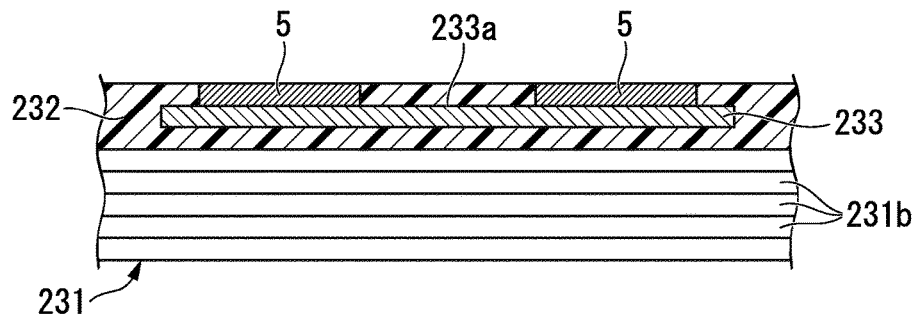
FIG. 4C is an explanatory diagram illustrating a process of producing the spar according to the first embodiment.

Next, the worker hardens the carbon-fiber prepreg 231. That is, the worker pressurizes and heats the carbon-fiber prepreg 231 while the conductive layer 233 is disposed on the surface 231a using a so-called autoclave. Then, the respective sheets 231b are integrated via the thermosetting resins by hardening the thermosetting resins impregnated into the respective sheets 231b constituting the carbon-fiber prepreg 231. Accordingly, at this time, as illustrated in FIG. 4C, the thermosetting resins exuded from the respective sheets 231b are laminated to cover the surface 231a of the carbon-fiber prepreg 231, thereby forming the resin layer 232. Thereby, the conductive layer 233 is embedded inside the resin layer 232. Further, the resin layer 232 is not formed at a position at which the masking tape 5 is pasted on the surface 233a of the conductive layer 233.

Figure 5A:
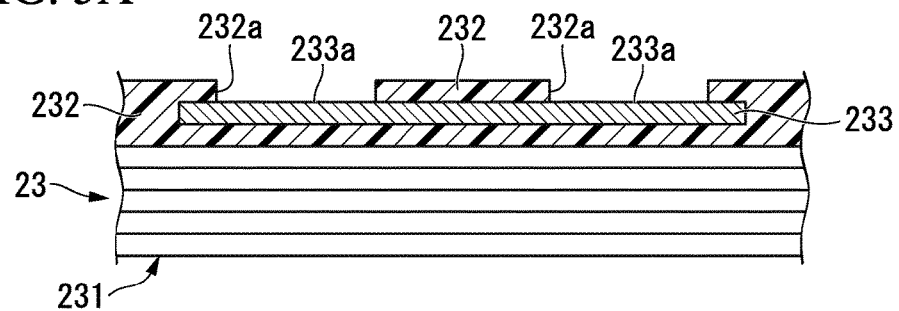
FIG. 5A is an explanatory diagram illustrating a process of producing the spar according to the first embodiment.

Next, the worker forms the conductive layer exposing hole 232a. That is, the worker removes the masking tape 5 from the state illustrated in FIG. 4C. Here, because the resin layer 232 is not formed at the position at which the masking tape 5 is pasted as described above, the surface 233a of the conductive layer 233 is exposed on a portion from which the masking tape 5 has been removed as illustrated in FIG. 5A. Thereby, the conductive layer exposing hole 232a is formed in the resin layer 232.

Figure 5B:
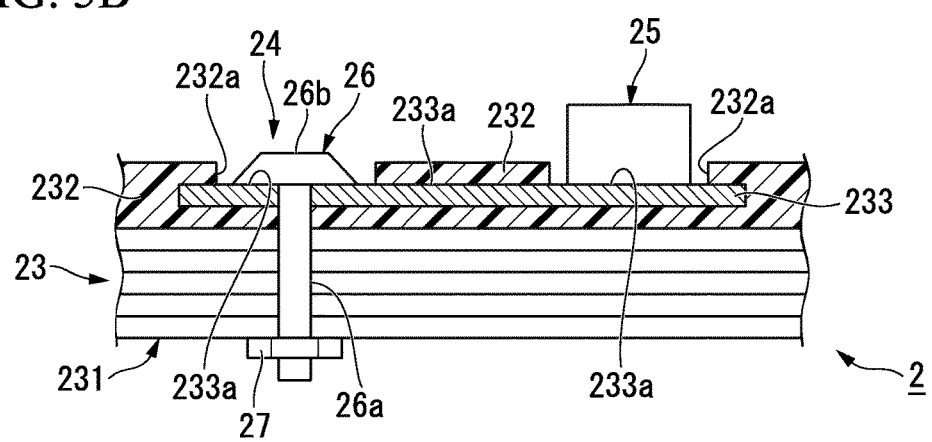
FIG. 5B is an explanatory diagram illustrating a process of producing the spar according to the first embodiment.

Next, the worker causes the jumper 24 to penetrate through the spar main body 23 formed as described above. That is, as illustrated in FIG. 5B, the worker causes the shaft portion 26a of the bolt 26 constituting the jumper 24 to penetrate through the conductive layer 233 exposed from the conductive layer exposing hole 232a of the resin layer 232. The worker further causes the shaft portion 26a to penetrate through the carbon-fiber prepreg 231 beneath the resin layer 232 by way of the resin layer 232 beneath the conductive layer 233. Accordingly, the lower surface of the head portion 26b of the bolt 26 is caused to contact with the surface 233a of the conductive layer 233. In addition, at this time, the worker fixes the jumper 24 to the spar main body 23 by screwing and fastening the nut 27 on the shaft portion 26a of the bolt 26 projecting from the backside of the spar main body 23. Further, if the carbon fiber of the carbon-fiber prepreg 231 is cut when the bolt 26 is caused to penetrate through the spar main body 23, the strength of the carbon fiber is degraded. Accordingly, it is desirable for the worker to insert the bolt 26 into a void space of a mesh-like carbon fiber so that the carbon fiber is not cut by the bolt 26 while securing contact between the bolt 26 and the carbon fiber and to cause the bolt 26 to penetrate therethrough by widening a mesh of the mesh-like carbon fiber.

Next, the worker attaches the electronic device 25 to the spar main body 23. That is, as illustrated in FIG. 5B, the worker attaches the electronic device 25 to the surface 233a of the conductive layer 233 exposed from the conductive layer exposing hole 232a of the resin layer 232 so that the lower surface of the electronic device 25 contacts with the surface 233a of the conductive layer 233. Accordingly, the electronic device 25 is electrically connected to the carbon-fiber prepreg 231 serving as the reference potential point via the conductive layer 233 contacting with the electronic device 25 and the jumper 24 contacting with the conductive layer 233. Thereby, the electronic device 25 is in a state in which conduction with the reference potential point is secured. Thereby, the spar 2 serving as the CFRP structure is completed.

As described above, according to a method of producing the spar 2 according to the first embodiment, the formation of the resin layer 232 on the surface 233a of the conductive layer 233 is locally prevented by the masking tape 5 when the carbon-fiber prepreg 231 is hardened. Accordingly, the jumper 24 and the conductive layer 233 can be more securely electrically connected.

In addition, because the conductive layer 233 is formed on the surface 231a of the carbon-fiber prepreg 231, the electronic device 25 can be installed directly in contact with the conductive layer 233. Thereby, because it is not necessary to separately provide wiring for electrically connecting the electronic device 25 to the conductive layer 233, the electronic device 25 can be electrically grounded through a simple configuration.

In addition, because the head portion 26b provided on the jumper 24 is caused to contact with the surface 233a of the conductive layer 233, the conductive layer 233 and the jumper 24 can be more securely electrically connected through the head portion 26b.

(Second Embodiment)

Next, a configuration of a CFRP structure according to a second embodiment of the present invention will be described. In the second embodiment, another example of a spar constituting a main wing of an aircraft will be described as the CFRP structure.

Figure 6:
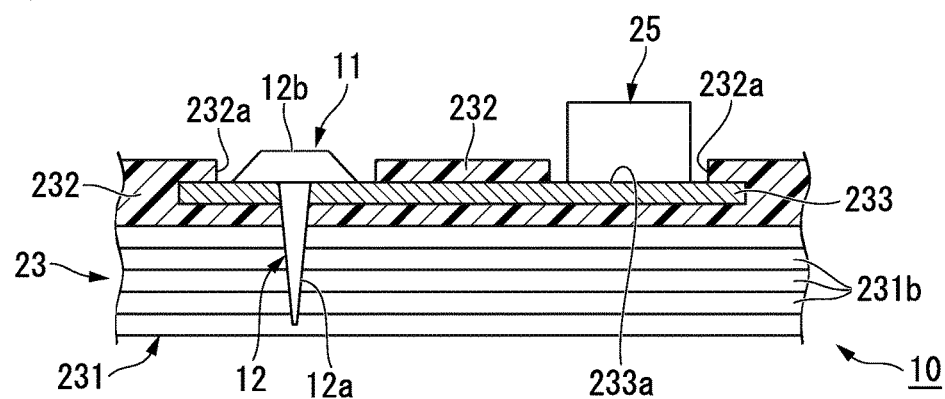
FIG. 6 is a schematic cross-sectional view illustrating a configuration of a spar according to a second embodiment.

FIG. 6 is a schematic cross-sectional view illustrating a configuration of a spar 10 according to the second embodiment. Compared to the spar 2 according to the first embodiment illustrated in FIG. 3, the spar 10 according to the second embodiment is only different in terms of a configuration of a jumper 11. Further, because other components are the same as those of the first embodiment, the same reference signs as those in FIG. 3 are assigned and a description thereof is omitted here.

As illustrated in FIG. 6, the jumper 11 according to the second embodiment is constituted of only a metallic bolt 12 provided to penetrate through a spar main body 23. Accordingly, the bolt 12 is the same as the bolt 12 of the first embodiment in that the bolt 12 has a shaft portion 12a and an umbrella-like head portion 12b provided on one end of the shaft portion 12a. However, a shape of the shaft portion 12a is different from that of the bolt 26 of the first embodiment. In further detail, the shaft portion 12a of the bolt 12 of the second embodiment has a cross-sectional shape of a wedge shape, that is, a cross-sectional shape of which a width is gradually narrowed from a base end to a tip end in its longitudinal direction.

According to the configuration of the above-described jumper 11, the tip end of the shaft portion 12a of the bolt 12 has a narrow width. Accordingly, in the process in which the worker causes the shaft portion 12a to penetrate through a spar main body 23, the tip end of the shaft portion 12a is inserted while a void space of a mesh-like carbon fiber constituting a carbon-fiber prepreg 231 is widened. In addition, by deeply inserting the shaft portion 12a into the carbon-fiber prepreg 231, the mesh of the carbon fiber is widened by the shaft portion 12a of which the width is gradually widened toward the base end. Accordingly, the continuity of the carbon fiber serving as the conductor can be secured without cutting the carbon fiber and the electrical conductivity of the overall carbon fiber can be secured.

(Third Embodiment)

Next, a configuration of a CFRP structure according to a third embodiment of the present invention will be described. In the third embodiment, another example of a spar constituting a main wing of an aircraft will be described as the CFRP structure.

FIGS. 7A, 7B, 7C, and 7D are explanatory diagrams illustrating a process of producing a spar 40 according to the third embodiment. Compared to the spar 2 according to the first embodiment illustrated in FIG. 3, the spar 40 according to the third embodiment is different in terms of configurations of a jumper 41 and an electronic device 42. Further, because other components are the same as those of the first embodiment, the same reference signs as those in FIG. 3 are assigned and a description thereof is omitted here.

Figure 7A:
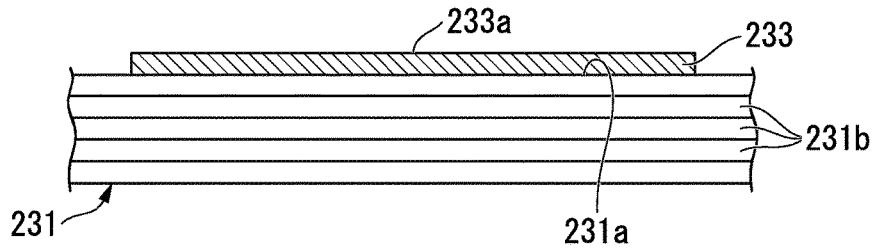
FIG. 7A is an explanatory diagram illustrating a process of producing the spar according to a third embodiment.
Figure 7B:
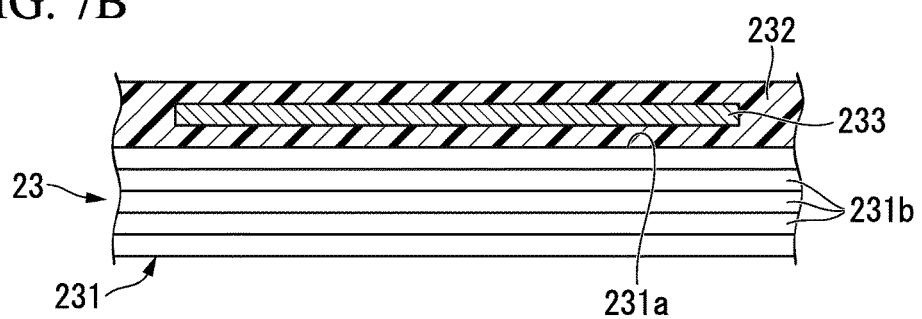
FIG. 7B is an explanatory diagram illustrating a process of producing the spar according to the third embodiment.
Figure 7C:
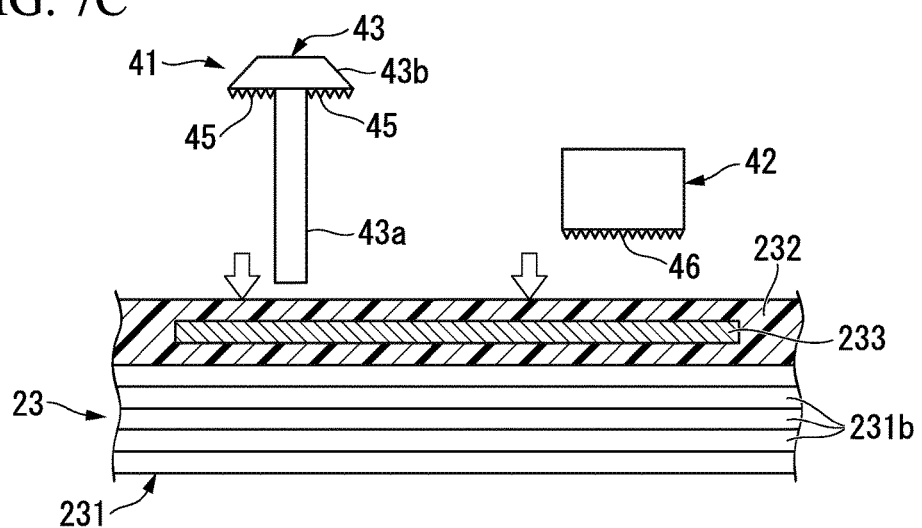
FIG. 7C is an explanatory diagram illustrating a process of producing the spar according to the third embodiment.
Figure 7D:
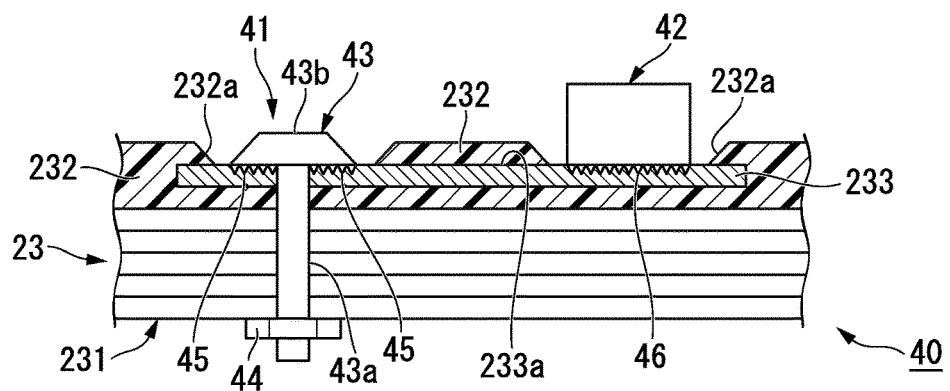
FIG. 7D is an explanatory diagram illustrating a process of producing the spar according to the third embodiment.

As illustrated in FIGS. 7C and 7D, the jumper 41 according to the third embodiment includes a metallic bolt 43 provided to penetrate through a spar main body 23 and a nut 44 screwed on the bolt 43. Accordingly, the bolt 43 is the same as the bolt 26 of the first embodiment in that the bolt 43 has a shaft portion 43a and an umbrella-like head portion 43b provided on one end of the shaft portion 43a. However, a shape of the shaft portion 43a is different from that of the bolt 26 of the first embodiment in that a plurality of projections 45 are provided on the lower surface of the head portion 43b. Each of the projections 45 is formed in a shape in which a tip end is sharply pointed.

As illustrated in FIGS. 7C and 7D, the electronic device 42 according to the third embodiment is different from the electronic device 25 of the first embodiment in that a plurality of projections 46 are provided on the lower surface of the electronic device 42. Each of the projections 46 is also formed in a shape in which a tip end is sharply pointed.

According to the above-described configurations of the jumper 41 and the electronic device 42, it is possible to simplify the attachment work on the spar main body 23 using the projections 45 and 46 provided on the lower surfaces of the jumper 41 and the electronic device 42. In further detail, the worker who is going to produce the spar 40 according to the third embodiment first forms a conductive layer 233 on a surface 231a of a carbon-fiber prepreg 231 as illustrated in FIG. 7A. That is, as in the first embodiment, the worker laminates a plurality of sheets 231b, each of which has a carbon fiber impregnated with a thermosetting resin, and disposes the conductive layer 233 at a predetermined position in the surface 231a of the carbon-fiber prepreg 231.

Next, as in the first embodiment, the worker hardens the carbon-fiber prepreg 231 by pressurizing and heating the carbon-fiber prepreg 231 and hardening the thermosetting resin. Then, as illustrated in FIG. 7B, a resin layer 232 is formed by forming a thermosetting resin exuded from a sheet 231b constituting each carbon-fiber prepreg 231 on the surface 231a of the carbon-fiber prepreg 231. Here, because the surface 231a of the conductive layer 233 is not masked in the third embodiment, as being done in the first embodiment, the resin layer 232 is formed across the entire surface 231a of the carbon-fiber prepreg 231.

Next, the worker causes the jumper 41 to penetrate through the spar main body 23. That is, as illustrated in FIG. 7C, the worker causes the shaft portion 43a of the bolt 43 constituting the jumper 41 to penetrate through the resin layer 232. Further, the shaft portion 43a is ultimately caused to penetrate through the carbon-fiber prepreg 231 by way of the resin layer 232 beneath the conductive layer 233 from the conductive layer 233 beneath the resin layer 232. Accordingly, as illustrated in FIG. 7D, the worker causes the lower surface of the head portion 43b of the bolt 43 to come in contact with the surface 233a of the conductive layer 233. At this time, a sharp-pointed projection 45 provided on the lower surface of the head portion 43b breaks the resin layer 232. Therefore, the lower surface of the head portion 43b of the bolt 43 can securely come in contact with the surface 233a of the conductive layer 233 and conduction between the conductive layer 23 and the carbon-fiber prepreg 231 can be secured. Accordingly, the worker fixes the jumper 41 to the spar main body 23 by screwing and fastening the nut 44 on the shaft portion 43a of the bolt 43 projecting from the backside of the spar main body 23.

Next, the worker attaches the electronic device 42 to the spar main body 23. That is, as illustrated in FIG. 7C, the electronic device 42 is attached to the spar main body 23 so that the lower surface of the electronic device 42 contacts with the surface 233a of the conductive layer 233. At this time, a sharp-pointed projection 46 provided on the lower surface of the electronic device 42 breaks the resin layer 232, so that the lower surface of the electronic device 42 can be caused to securely contact with the surface 233a of the conductive layer 233.

As described above, because it is unnecessary to perform pre-processing such as the process of masking the surface 231a of the carbon-fiber prepreg 231 before the process of hardening the carbon-fiber prepreg 231 in accordance with a method of producing the spar 40 according to the third embodiment, it is possible to promote labor-saving due to the reduction of an amount of a work process and the reduction of cost due to the reduction of an amount of a masking tape 5 or the like.

Further, although the projection 45 and the projection 46 are provided in the jumper 41 and the electronic device 42, respectively, in this embodiment, a configuration in which the projection 46 is provided in the lower surface of the electronic device 42 is not indispensible in the present invention. It is only necessary to provide the projection 45 in at least the jumper 41.

(Fourth Embodiment)

Next, a configuration of a CFRP structure according to a fourth embodiment of the present invention will be described. In the fourth embodiment, another example of a spar constituting a main wing of an aircraft will be described as the CFRP structure.

Figure 8:
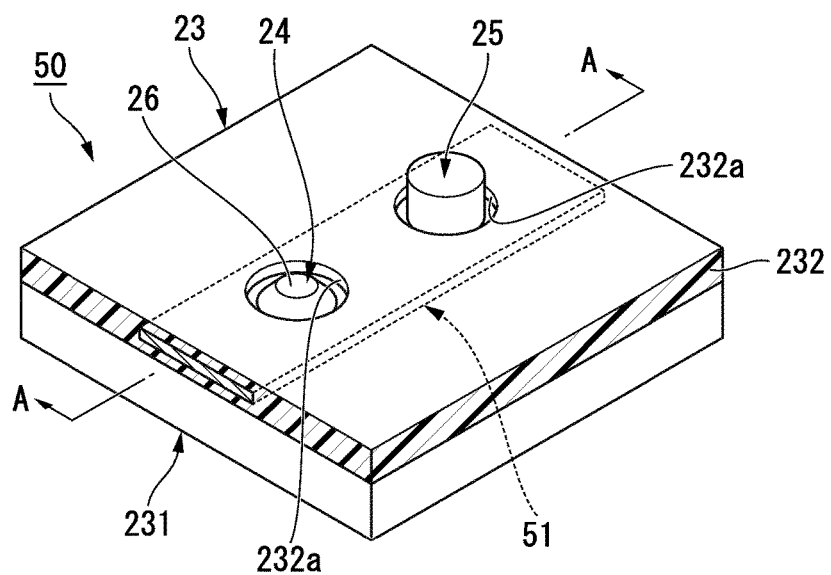
FIG. 8 is a schematic perspective view illustrating a part of a spar according to a fourth embodiment.

FIG. 8 is a schematic perspective view illustrating part of a spar 50 according to the fourth embodiment. Compared to the spar 2 according to the first embodiment illustrated in FIG. 2, the spar 50 according to the fourth embodiment is only different in terms of a configuration of a conductive layer 51. Furthermore, because other components are the same as those of the first embodiment, the same reference signs as those in FIG. 2 are assigned and a description thereof is omitted here.

The conductive layer 51 according to the fourth embodiment is the same as the conductive layer 233 of the first embodiment in that the conductive layer 51 is a metallic thin plate member with conductivity, that a thickness of the conductive layer 51 is formed to be thinner than that of a resin layer 232, and that the conductive layer 51 is provided to be embedded in the resin layer 232. However, the conductive layer 51 according to the fourth embodiment is different from the conductive layer 233 of the first embodiment in that the conductive layer 51 is formed in a strip shape, that is, in an elongated substantially rectangular shape, in plane view. Accordingly, as illustrated in FIG. 8, a size in the longitudinal direction of the conductive layer 51 is set to be substantially the same as a width of the carbon-fiber prepreg 231.

According to the configuration of the above-described conductive layer 51, both ends of the longitudinal direction of the conductive layer 51 reach both ends of the width direction of the carbon-fiber prepreg 231, respectively. Accordingly, although not illustrated in the drawings in detail, there is an advantage in that a length of electrical wiring can be minimized if both ends of the longitudinal direction of the conductive layer 51 of each spar 50 are connected by electrical wiring when it is necessary to electrically connect the spar 50 illustrated in FIG. 8 to the spar 50 installed in the vicinity of the spar 50.

Further, the spars 2, 10, 40, and 50 constituting the main wing 1 of the aircraft have been described as an example of the CFRP structure in the above-described embodiments. However, the CFRP structure is not limited to the spars 2, 10, 40, and 50. The CFRP structure, for example, may be the upper skin 31a and the stringer 31b constituting the upper panel 31 illustrated in FIG. 1, the lower skin 32a and the stringer 32b constituting the lower panel 32, and the like. Further, the CFRP structure is not limited to the component of the main wing 1 of the aircraft, and may be a component of an arbitrary structure.

Furthermore, various shapes, combinations, operation procedures or the like of each component illustrated in the above-mentioned embodiments serve as an example, and various modifications can be made based on the design requirement and the like without departing from the spirit or scope of the present invention.

INDUSTRIAL APPLICABILITY

The present invention, for example, is applicable to means for adding a secondary function of electrically grounding an electronic device attached to a surface of a CFRP structure formed of CFRP to the CFRP structure in a structure constituting a main wing of an aircraft.

DESCRIPTION OF REFERENCE NUMERALS

1 Main wing
10 Spar (second embodiment)
11 Jumper
12 Bolt
2 Spar
21 Front spar
22 Rear spar
23 Spar main body
231 Carbon-fiber prepreg
231a Surface (carbon-fiber prepreg)
231b Sheet (carbon-fiber prepreg)
232 Resin layer
232a Conductive layer exposing hole
233 Conductive layer
233a Surface (conductive layer)
24 Jumper
25 Electronic device
26 Bolt
26a Shaft portion
26b Head portion
27 Nut
3 Panel
31 Upper panel
31a Upper skin
31b Stringer
32 Lower panel
32a Lower skin
32b Stringer
4 Rib
40 Spar (third embodiment)
41 Jumper
42 Electronic device
43 Bolt
43a Shaft portion
43b Head portion
44 Nut
45 Projection (jumper)
46 Projection (electronic device)
5 Masking tape
50 Spar (fourth embodiment)
51 Conductive layer

The invention claimed is:

1. A carbon-fiber-reinforced plastic structure comprising:
a carbon-fiber prepreg including a thermosetting resin and a carbon fiber;
a conductive layer laminated and formed on a surface of the carbon-fiber prepreg;
a resin layer formed by the thermosetting resin exuded from the carbon fiber when the thermosetting resin is hardened;
a jumper formed of a conductor having a shaft portion which penetrates through the conductive layer and the carbon-fiber prepreg, and a head portion which is electrically connected to the conductive layer and provided on an end of the shaft portion; and
an electronic device electrically connected to the conductive layer,
wherein:
the conductive layer is located inside the resin layer and surrounded by the resin layer from all directions,
the electronic device is provided outside the resin layer,
a lower surface of the head portion is in contact with a surface of the conductive layer such that the head portion is only in contact with the conductive layer in one plane,
all of the head portion is located outside the carbon-fiber prepreg, and
a periphery of the head portion is surrounded by the resin layer.

2. The carbon-fiber-reinforced plastic structure according to claim 1, wherein projections are provided on the lower surface of the head portion.

3. The carbon-fiber-reinforced plastic structure according to claim 1, wherein the resin layer is laminated on the surface of the carbon-fiber prepreg and is in contact with both surfaces of the conductive layer.

4. The carbon-fiber-reinforced plastic structure according to claim 2, wherein each of the projections provided on the lower surface of the head portion is sharp-pointed.

5. A method of producing a carbon-fiber-reinforced plastic structure, comprising:
forming a conductive layer on a surface of a carbon-fiber prepreg, the carbon-fiber prepreg including a thermosetting resin and a carbon fiber;
masking a surface of the conductive layer;
forming a resin layer so that the conductive layer is located inside the resin layer and surrounded by the resin layer from all directions by the thermosetting resin exuded from the carbon fiber when the thermosetting resin is hardened;
exposing the conductive layer from the resin layer by removing the masking;
causing a lower surface of a head portion of a jumper formed of a conductor to come into contact with a surface of the exposed conductive layer such that the head portion is only in contact with the exposed conductive layer in one plane, placing all of the head portion outside the carbon-fiber prepreg, surrounding a periphery of the head portion by the resin layer, and causing a shaft portion having an end on which the head portion is provided to penetrate through the carbon-fiber prepreg; and
attaching an electronic device to the surface of the exposed conductive layer so that the electronic device contacts the surface of the exposed conductive layer, the electronic device being provided outside the resin layer.

6. The method of producing a carbon-fiber-reinforced plastic structure according to claim 5, wherein the resin layer is laminated on the surface of the carbon-fiber prepreg and is in contact with both surfaces of the conductive layer.

7. A method of producing a carbon-fiber-reinforced plastic structure, comprising:
forming a conductive layer on a surface of a carbon-fiber prepreg, the carbon-fiber prepreg including a thermosetting resin and a carbon fiber;
hardening the carbon-fiber prepreg;
causing a jumper formed of a conductor having a projection on a lower surface of a head portion to break a resin layer formed by the thermosetting resin exuded from the carbon fiber on a surface of the conductive layer using the projection, placing all of the head portion outside the carbon-fiber prepreg, causing a shaft portion having an end on which the head portion is provided to penetrate through the carbon-fiber prepreg, causing the lower surface of the head portion to contact the surface of the conductive layer which is located inside the resin layer and surrounded by the resin layer from all directions such that the head portion only lies on the conductive layer in one plane, and surrounding a periphery of the head portion by the resin layer, when the carbon-fiber prepreg is hardened; and
attaching an electronic device to the surface of the conductive layer so that the electronic device contacts the surface of the conductive layer by breaking the resin layer with a projection provided on the lower surface of the electronic device, the electronic device being provided outside the resin layer.

8. The method of producing a carbon-fiber-reinforced plastic structure according to claim 7, wherein the projection on the lower surface of the head portion is one of a plurality of projections having shapes in which tip ends of the projections are sharp-pointed.

9. The method of producing a carbon-fiber-reinforced plastic structure according to claim 7, wherein the resin layer is laminated on the surface of the carbon-fiber prepreg and is in contact with both surfaces of the conductive layer.

10. The method of producing a carbon-fiber-reinforced plastic structure according to claim 7, wherein the projection provided on the lower surface of the electronic device is sharp-pointed.

11. The method of producing a carbon-fiber-reinforced plastic structure according to claim 7, wherein the projection provided on the lower surface of the electronic device is one of a plurality of projections.

12. The method of producing a carbon-fiber-reinforced plastic structure according to claim 11, wherein each of the plurality of projections provided on the lower surface of the electronic device is sharp-pointed.

* * * * *